United States Patent
Zens et al.

(10) Patent No.: US 7,106,063 B1
(45) Date of Patent: Sep. 12, 2006

(54) AXIALLY CONSTRAINED RF PROBE COIL

(75) Inventors: Albert P. Zens, Salinas, CA (US); Peter Nakatani, Concord, CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 11/198,077

(22) Filed: Aug. 5, 2005

(51) Int. Cl.
*G01V 3/00* (2006.01)

(52) U.S. Cl. ..................... 324/318; 324/422

(58) Field of Classification Search ............. 324/318, 324/322, 319, 309, 307, 300; 600/410, 422
See application file for complete search history.

(56) References Cited

U.S. PATENT DOCUMENTS

| | | | |
|---|---|---|---|
| 4,388,601 A | * | 6/1983 | Sneed et al. ............. 333/227 |
| 4,517,516 A | | 5/1985 | Hill et al. |
| 4,549,136 A | | 10/1985 | Zens |
| 4,607,224 A | | 8/1986 | Codrington |
| 5,192,911 A | | 3/1993 | Hill et al. |
| 6,008,650 A | | 12/1999 | Behbin |
| 6,054,855 A | * | 4/2000 | Anderson ............... 324/318 |
| 6,917,201 B1 | | 7/2005 | de Swiet |

* cited by examiner

*Primary Examiner*—Btij B. Shrivastav
(74) *Attorney, Agent, or Firm*—Edward H. Berkowitz; Bella Fishman

(57) ABSTRACT

An NMR resonant structure is formed of axial conductors (54a, 54b, 54c, and 54d) and end members (50,51), supporting said conductors to form a coil structure (8) of desired electrical topology wherein the end members combine the function of RF interconnects between selected axial conductors (inductors) with an axial constraint on RF field prevailing outside the axial bounds of the end members, and if so desired, comprise a selected capacitance 61 for the resonant structure.

10 Claims, 7 Drawing Sheets

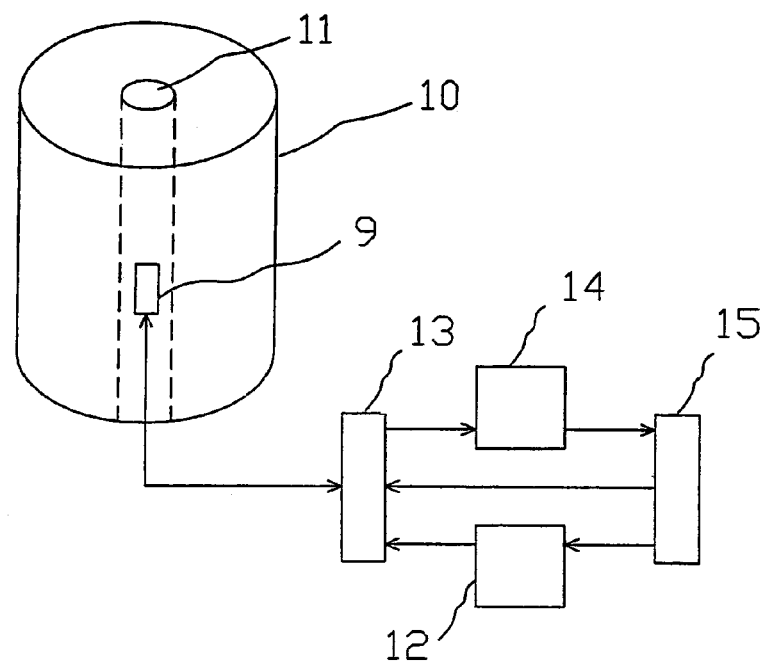
Fig 1
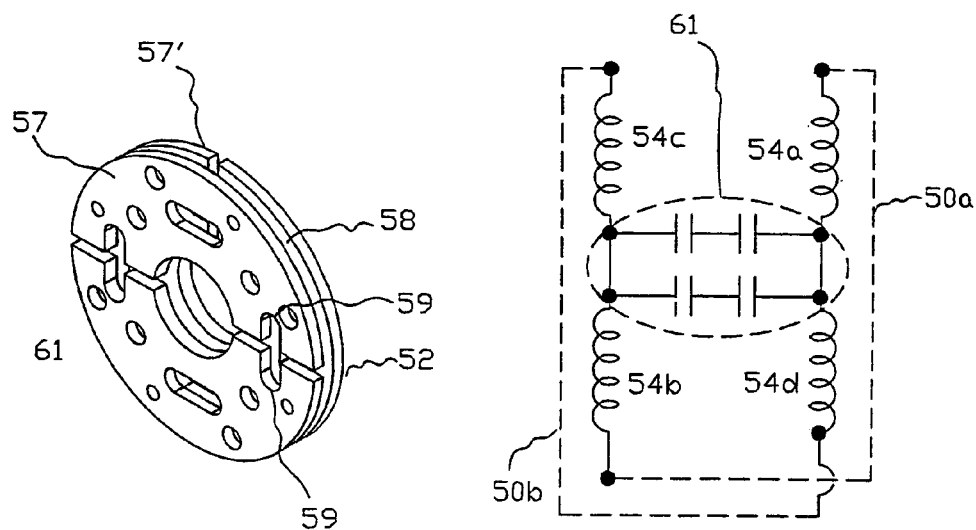
Fig 2c
Fig 2f

US 7,106,063 B1

AXIALLY CONSTRAINED RF PROBE COIL

BACKGROUND OF THE INVENTION

This work relates to nuclear magnetic resonance (NMR) apparatus and particularly to the RF coupling to nuclei of the sample under study. This is the function of a module widely termed the NMR probe, which controls the distribution of the RF field within a sensitive region. A sample within the sensitive region is closely coupled to the RF radiation generated in the sensitive region for spin excitation and subsequently emitted with the de-excitation of sample nuclei. The heart of the probe is the RF coil and the salient property of such coil in typical use is the degree of homogeneity of the RF field achieved over the interior of the sensitive volume defined by the coil. It is also desired to constrain the RF field distribution for the coil to a limited region within the sensitive volume because the spatial variation of the polarizing magnetic field is not eliminated outside of the sensitive volume.

Limiting the spatial distribution of the RF field of the NMR coil is the subject of a number of prior art works. Of particular interest for this purpose are U.S. Pat. Nos. 6,008, 650 and 5,192,911, both commonly assigned herewith. In general these works describe shielding implemented to protect the sensitive volume of the resonance apparatus from RF influence external thereto, or, to reduce the RF field of the coil outside of the sensitive volume. For example, it is desired to shield that portion of the sample extending beyond the sensitive volume from irradiation arising from the coil or the coil leads. This does not protect that same portion of the sample (disposed in a possibly slightly different polarizing field) from irradiation due to the RF field distributed predominantly, but not completely in that sensitive volume. In general these shielding arrangements include a conducting member, typically of cylindrical form, coaxial with the sample axis and axially displaced from the central region of the RF coil. Such shielding predominantly attenuates the radial components of the RF field in the axial region beyond the shield structure.

Another approach to the problem of undesired excitation of sample outside the sensitive volume is based upon physically limiting the sample volume to coincide with the axial extent of the probe coil. In order to avoid axial discontinuity in magnetic susceptibility, the prior art utilized plugs, susceptibility matched to the sample, and inserted into the sample vessel to confine the sample to the desired region, coincident with the probe coil. This is disclosed by U.S. Pat. No. 4,549,136 to Zens, commonly assigned herewith.

RF cavity resonators are known for NMR apparatus and such resonators effectively contain the internal RF field and therefore shield the sample volume from RF influence external to the cavity. A representative example of such NMR cavity resonator is disclosed in U.S. Pat. No. 4,607, 224, commonly assigned herewith. Although the cavity structure provides both axial and radial constraint to the field distribution, the ability is lost to impose an independent RF field on the sample from outside of such resonator. This is a necessary tool for spin decoupling and for a number of multiple resonance techniques.

SUMMARY OF THE INVENTION

A novel RF resonator structure features an RF resonator (or "coil") that includes axial constraint to the RF dipole field generated in the sensitive volume defined by the coil. This constraint serves to shield those portions of the physical sample located outside the sensitive volume. This is the usual case for liquid samples disposed in a long tube. This axial constraint also serves as a conducting member of the coil forming the azimuthal interconnects between the axial inductive members of the coil. The novel coil is an "open" structure; that is, a second, coaxial coil, outside of the "open" coil, may be arranged to independently irradiate a sample tube disposed on the common axis of the two resonators.

The field confining/interconnect structure is mechanically an end member of a coil support or former and has yet another benefit in providing a platform for realizing a lumped capacitance and supporting an adjustable (vernier) capacitance in close proximity to the coil itself. The field confining structure is preferably a composite of conducting surface-dielectric-conducting surface to provide a selected value of capacitance in parallel with the coil structure. One end member of a coil preferably includes a third capacitive member comprising another conductor, axially displaced from the outward facing conducting surface, axially outside the sensitive volume of the coil and disposed for precise axial translation to provide a capacitive vernier. In a preferred arrangement, the RF excitation source is inductively coupled to the coil through a loop proximate the axial inductive members of the coil.

Following the general structure for an RF coil comprising end members in combination with inductive members, the interconnect function of one or both of the end members can be exploited to yield a variety of types of RF resonators.

BRIEF DESCRIPTION OF THE DRAWINGS

FIG. 1 is a concise illustration of the context of the novel probe coil.

FIG. 2c illustrates a complex end member forming a fixed capacitance.

FIG. 2f is an effective circuit for the coil of FIGS. 2a,b

FIG. 5b is a section through the end member of FIG. 5a.

DETAILED DESCRIPTION OF THE INVENTION

Figure 2A:
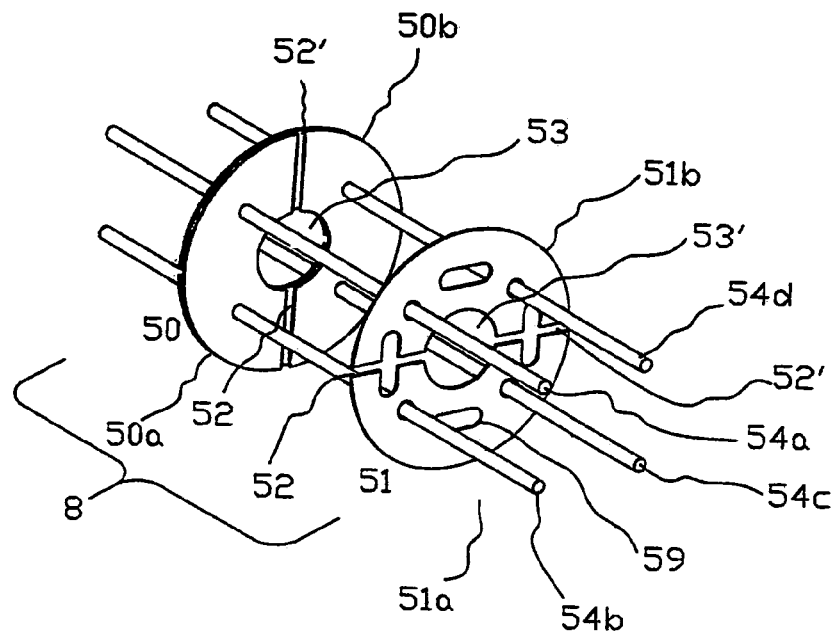
FIG. 2a shows the basic aspect of the novel coil.

The context of the invention is conceptually illustrated in FIG. 1 (the same label appears in the several figures for the same object.) An NMR probe 9 is disposed within the bore 11 of a superconducting magnet 10. A sample for analysis is presented in a sample vessel (not shown) inserted in the probe 9. The probe 9 inductively couples to the nuclear spins of the sample for excitation through at least a first RF excitation channel 12 and separately for signal acquisition through a receiver channel 14. Excitation and receive functions often share a common probe coil for non-concurrent operation through correlator 13, but multiple coils are frequently employed to serve different functions, such as spin decoupling, field-frequency lock, and the like. The receive channel ordinarily includes a preamplifier and RF demodulator, phase detector, analog-to-digital conversion (ADC) and various signal processing apparatus together with a digital processor 15 to effect averaging, Fourier transformation, storage and the like. In like manner, processor 15 controls both the excitation channel 12 and receive channel 14. More recently, some of these functions are consolidated in a direct digital receiver, but these variations are not critical to the understanding or operation of the present probe.

The essential component of the probe 9 is one, or more resonant structures, e.g., coils, for coupling nuclear spins of sample molecules to excitation channel 12 and receive channel 14. The basic essentials of the present axially constrained RF coil 8 are shown in FIG. 2a. Facing conducting planar end members 50 and 51 are each composed of segments 50a and 50b, and 51a and 51b, respectively. The segments have a common boundary, (shown here as the diameter of a disk shaped end member, but not limited to such geometry). Each pair of segments (of each end member) are displaced across the common boundary to form slots 52 and 52' which define the corresponding segment and provide for electrical isolation therebetween. Apertures 53 and 53' are formed in respective end members and these are in axial alignment to receive an NMR sample vessel. Slots 52 and 52' are arranged in angular offset: Here, the angular offset is shown as 90o for a simple case. Paraxial conductors 54a, 54b, 54c and 54d are shown for a simple embodiment. The paraxial conductors 54a, 54b, 54c, and 54d are of such length to extend well beyond the bound of the sensitive volume. Preferably, the total length is about 3 times the axial extent of the coil itself with the coil increment centered. This arrangement removes, to a large extent, a discontinuity in axial dependence of gross magnetic susceptibility. See U.S. Pat. No. 4,517,516 to Hill and Zens, commonly assigned.

A first adjacent pair of such conductors, 54a and 54b, is arranged such that at one end, the adjacent ends of conductors 54a and 54b are commonly connected to the same segment 50a, while at the other end of the adjacent pair, the two conductors connect to separate segments 51a and 51b, forming one loop of the coil. The second pair of paraxial conductors, 54c and 54d, are similarly connected to segments 51b and 50a and 50b. The electrical topology of this arrangement is immediately recognizable as that of a saddle coil with the added feature that each end member offers significant shielding to restrict undesired axial extension of the RF field as it is exists beyond those end members 50 and 51. For simplicity, a single turn saddle coil is a convenient model for illustration. A saddle coil of more than one turn is a straightforward extension of this discussion.

Alternate electrical topology for the RF coil is obtained through appropriate design of one or both of the end members 50, 51. For example, if one substitutes an unslotted planar conductor for end member 50 of FIG. 2a, the conducting (inductive) members 54a and 54b are commonly connected at that end member of the coil and the resulting structure support two RF current loops on opposite sides of the sample axis: a first loop comprises conducting members 54a and 54b, in parallel with a second loop comprising conducting members 54c and 54d.

Figure 2B:
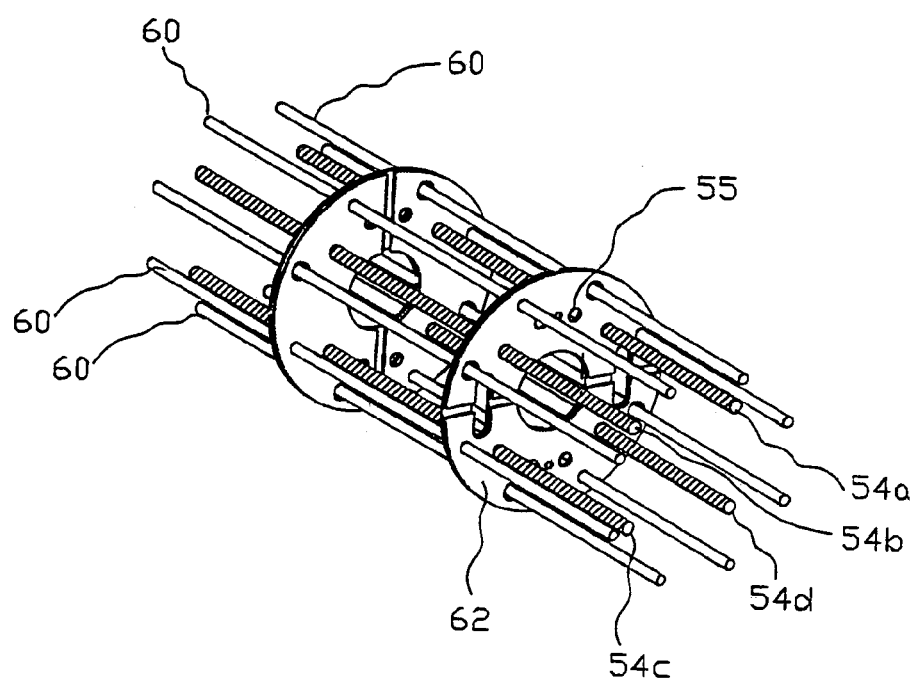
FIG. 2b shows the basic structure with further structural enhancement.

FIG. 2b illustrates additional structure of this form of preferred embodiment. (For clarity of presentation, all labels from FIG. 2a are not repeated in FIG. 2b.) Non-conductive paraxial rods 60 are added radially outside the paraxial conductors 54a, 54b, 54c, and 54d, which are shown here with shading to aid the eye. Rods 60 provide structural stability and support for an adjustable capacitor plate 62 (more particularly shown in FIG. 2d) which capacitively couples to end member 51. It is a further preference that end member 51 has a composite structure as shown in FIG. 2c, that is, an additional one or more planar conducting members 57, 57' displaced by dielectric layer (or empty space) 58 to constitute selected fixed capacitance(s) and form a conducting shield surface of end plate 51. This structure may be formed from discrete components, such as for example, standard printed circuit board or copper sheet and dielectric of thin planar sapphire or a simple gap. In accord with circuit requirements, the capacitance(s) may be implemented at either or both end members. FIG. 2c represents a further extension of the structure of end member 51 to support lumped capacitance for the resonant probe coil. The capacitances of FIG. 2c are implemented with the outward facing conductor 57 (facing outside the sensitive volume of coil 8) having a segmented construction defined by slot 56. With the orientation of slots 56 and 52 orthogonal the respective segmented conducting faces of the capacitor-end member 61 form two parallel pairs of series capacitors. The effective circuit of FIG. 2f is completed with the dotted connection supplied by end plate 50. Other apertures 59, one of which is so labeled, are provided for various purposes as discussed below. It is apparent that endplate(s) 50 and/or 51 serve multiple purposes of RF field confinement, coil member interconnects, and implementation of a capacitive element. One of the slots 59 is provided for admittance of a feed from an RF source as shown in FIG. 2e. Preferably, in a preferred arrangement, an inductive coupling loop is employed between the RF source and the coil for excitation to minimize inductive losses from leads. The inductive loop leads are in close mutual proximity and thus tend to provide a cancellation of distributed parasitic inductive effect.

Figure 2D:
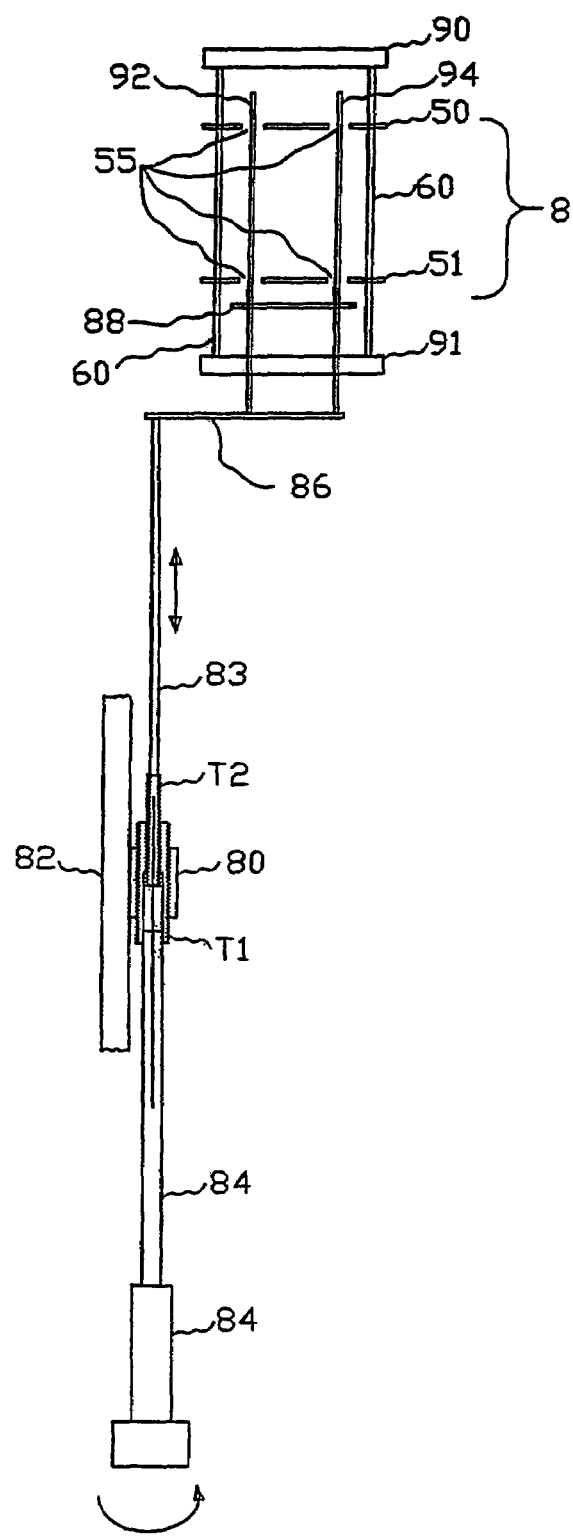
FIG. 2d shows an adjustable capacitance implemented with coaxial threaded shafts.
Figure 2E:
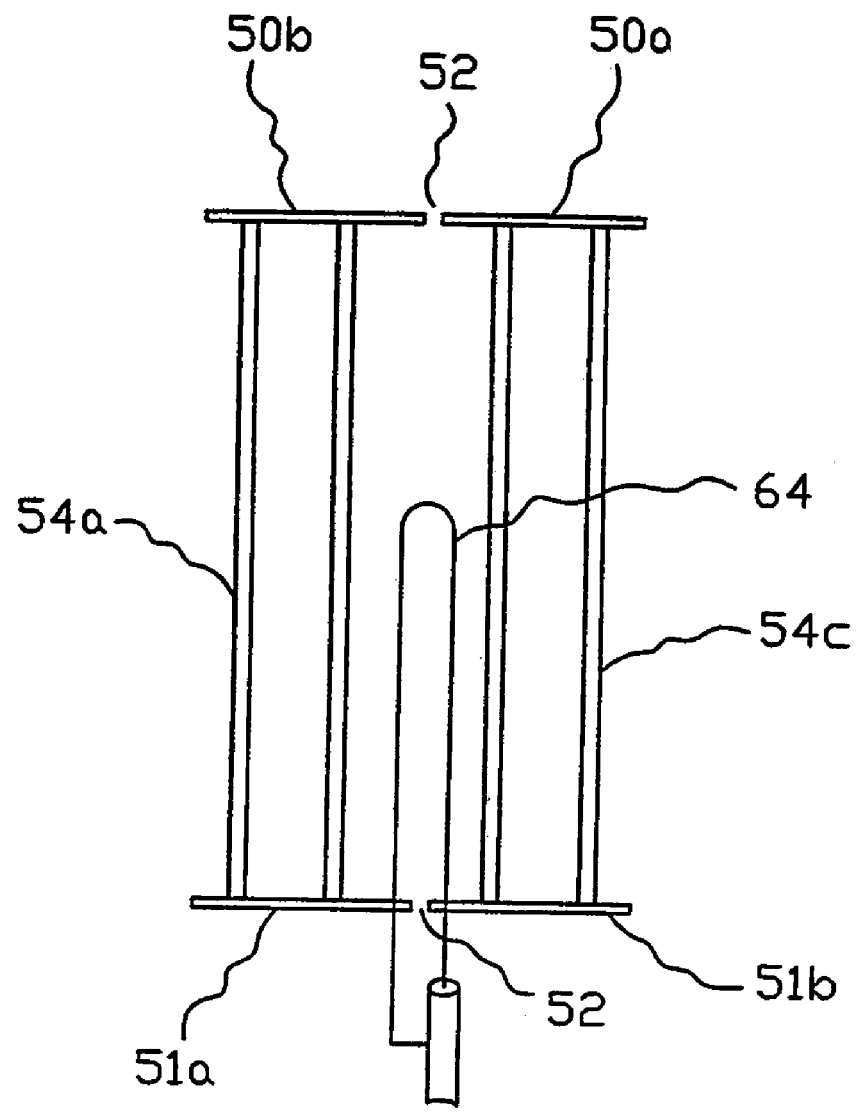
FIG. 2e is preferred arrangement using a magnetic coupling loop.

FIG. 2d shows one mechanical tuning linkage for precise displacement of an adjustable (vernier) capacitor plate 88. This linkage is enabled through a differential threaded coaxial shaft arrangement as shown in simplified form in FIG. 2d. An immobile nut 80 is fixed relative to a strut 82 that is part of the probe support and enclosure structure. Threaded outer shaft 84 is rotated externally for capacitance adjustment and, as a consequence, translates axially in the thread T1 of the immobile nut 80. Outer shaft 84 has a threaded bore T2 mating with inner threaded shaft 83 which in turn translates axially toward immobile nut 80 if T1 and T2 have the same sense of pitch. Through a cantilever linkage 86, the adjustable capacitor plate 88 travels in a precise drive reduced relationship (depending upon the relative pitches T1 and T2) to rotation of outer shaft 84. The coil 8 is conveniently referred to FIG. 2a, to which there are added stops 90 and 91 and an additional set of insulating rods 92 and 94. The insulating rods 92 and 94 differ from insulating rods 60 in that they are fixed in respect of adjustable plate 88 and are slidably supported through appropriate apertures 55 in end members 50 and 51.

The adjustable plate 88 comprises a segmented construction similar to the end member segmentation. The relative orientation of the plate 88 segments with the facing segments of the proximate end member correspond to simple series connection of the vernier capacitance for congruent relative orientation and parallel connection for the orthogonal relative orientation.

Drive reduction through differential threaded shafts is known. Differential threaded coaxial shafts achieve excellent drive reduction without the need for plural shafts and conventional gearing and concurrently, the desired rotary to translatory conversion. Such structure is ideal for the necessarily compact structure of an NMR probe. A known class of NMR probe for magic angle spinning, sold under the designation Varian Chemagnetics Double Resonance HXMAS and Triple Resonance HXYMAS, employ similar drive reduction linkage for precise adjustment of the spinning axis inclination.

It should be appreciated that the example illustrated in FIGS. 2a–f represents a simple example of a coil consisting of an RF current dipole supported by inductive members disposed on opposite sides of a sample. A greater number coil turns, is available by suitable extension of the number and arrangement of segments. One common and here, preferred form of saddle coil is shown in FIGS. 2a, 2b, 2c, and 2f; that is, parallel connection of facing current loops to provide a transverse RF magnetic field and transverse to the axis of the sample tube and polarizing field. An NMR probe featuring the above described resonant coil has been built for operation at 700 MHz. The interconnect function of the end member is easily altered to provide serial connection of the loops if such structure is desired. Moreover, other forms of resonator (as described below) may advantageously use the versatile end member structure of this work to support the desired electrical topology. The geometry of the interconnects is not limited to arcuate segments, but is readily adaptable to different RF field configurations. It is a matter of design choice whether both end members implement a desired capacitance. It is a desirable result of segmented construction that the influence of eddy currents is reduced.

As a result of the structure of the fixed and variable capacitance described above, these reactive elements are placed in very close proximity to the coil. Parasitic reactive elements (attributable to leads) are thereby reduced. The structure of FIGS. 2a and 2b contrasts with structure such as the well-known Alderman-Grant resonator and its derivatives. These, as well as the present structure, exhibit a minimal inductance for the LC resonant device. However, the Alderman Grant type resonators derive their capacitive reactance from distributed capacitance furnished by axial extension of the slotted tube. In certain applications, such as magic angle spinning, extended axial structure conflicts with the spatial limitations of the superconducting magnet bore. Moreover, contemporary magic angle spinner apparatus employs a pair of gas bearings displaced along the spinning axis. An Alderman-Grant resonator of conventional form, commonly employed in such arrangement, requires substantial physical length (along the spinning axis) to supply the necessary capacitance. This, again conflicts with spatial limitations of the magnet bore because the bore axis and spinning axis are at an angle of about 54°. The present structure presents a reduced spatial extension in comparison with the conventional Alderman-Grant resonator.

Figure 3:
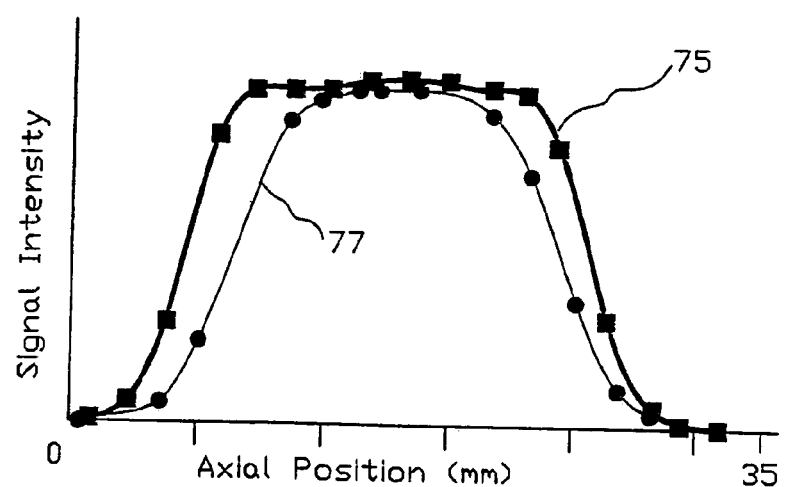
FIG. 3 compares axial distribution of signal intensity for a conventional coil and the axially constrained coil of this work.

FIG. 3 is a comparison of axial distribution of signal intensity for the axial-field constrained coil (curve 75) with a conventional coil (curve 77) of the same axial and radial dimensions. This data was acquired using a standard sample tube containing a water droplet of about 1 mm axial extent. The droplet was advanced along a graduated scale by selected displacement to acquire each datum. Observe that both curves reach null signal value at identical axial coordinates as would be expected for coils of the same overall dimensions. There is a similar flat response of signal as a function of axial displacement within the sensitive volume for both coils, but the axial extent of the flat region is greater for the present coil construction, and distinction is also found in the rate of signal attenuation outside the sensitive volume, where the axially constrained coil exhibits a steeper fall-off of signal. This behavior reflects the comparison of the apertured end member of the present coil compared to the conventional coil that is fully open, e.g., unshielded. The particular example plotted in FIG. 3 features an aperture of 6 mm and an outer diameter of the coil of 12 mm, forming a nominal 75% shield compared with the 0% shield of the conventional coil which exhibits essentially transparent axial bounds. While it appears that a smaller aperture relative to coil diameter will yield a better measure of axial confinement of the RF field such condition similarly implies a smaller filling factor and therefore, lower signal amplitude.

Figure 4:
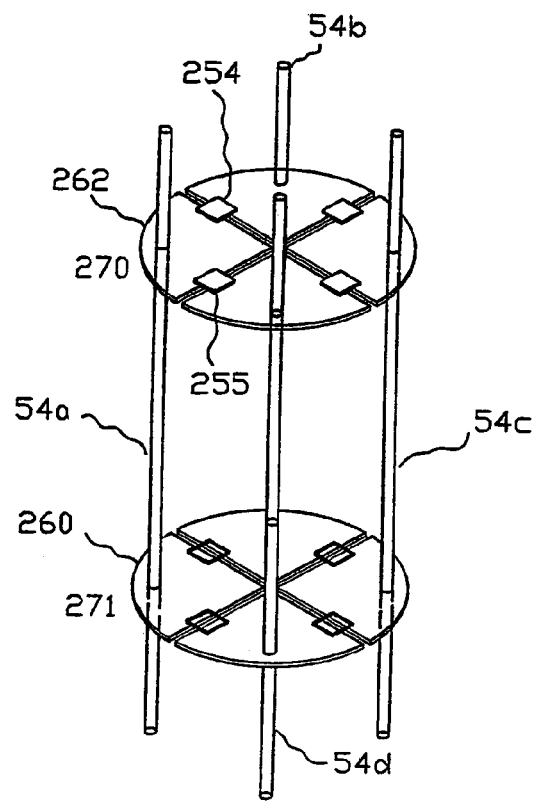
FIG. 4 is a birdcage coil exhibiting the present axially constrained feature.

The multi-use end members of the present work may be employed to implement birdcage type resonators as shown in FIG. 4. For clarity of presentation, a 4 rung birdcage resonator is shown, but it is understood that the number of rungs is not a limitation. Slotted end members 270 and 271 are disposed with respective slots in parallel orientation. That is, the segments of respective end members are congruently oriented, in contrast with the saddle coil of FIG. 2a. For example, inductive member 54a is in electrical contact with segments 260 and 262 at corresponding ends of the conductive (inductive) member 54a. As shown, adjacent inductive members 54b and 54d are coupled to inductive member 54a through chip capacitors 254 and 255. Each inductive member is directly connected to a unique segment at the respective end member. As an alternative to chip capacitors, an end member may be designed to implement the coupling capacitances through a composite construction of first and second segmented conductive surfaces sandwiching a dielectric with rotation of the segment defining slots to establish the desired capacitances. The inner facing segments of each end member remain in one-to-one association, together with the corresponding paraxial conductor to form the well-known birdcage network.

In all of the examples discussed, the conducting surfaces of end member construction typically exhibited segmented areas bounded and defined by slots. In this manner, eddy current effects are minimized when the active probe is immersed in a polarizing field of the magnet 10.

In combination with appropriately designed end members, the inductive members have been shown to implement saddle coil (FIGS. 2a,b) and birdcage (FIG. 4) resonators. It should be apparent that the interconnect function of the end member may be arranged to implement electrically serial RF loops. A single pair of paraxial conductors (inductors) may be interconnected to form an Alderman-Grant type resonator.

Although the figures and discussion imply coincidence of the outer coil diameter with the outer dimensions of an axial shield/end member, this is not required. As suggested above, there is a trade-off in the balance of filling factor (large aperture relative to radial coil extent) with axial confinement (small aperture relative to the radial coil dimension). To reflect this consideration, in another embodiment the paraxial conductors (inductive members) are distributed on radii approaching the outer dimensions of the sample vessel while the axial shield exhibits rather larger radial dimensions than those of the coil.

Figure 5A:
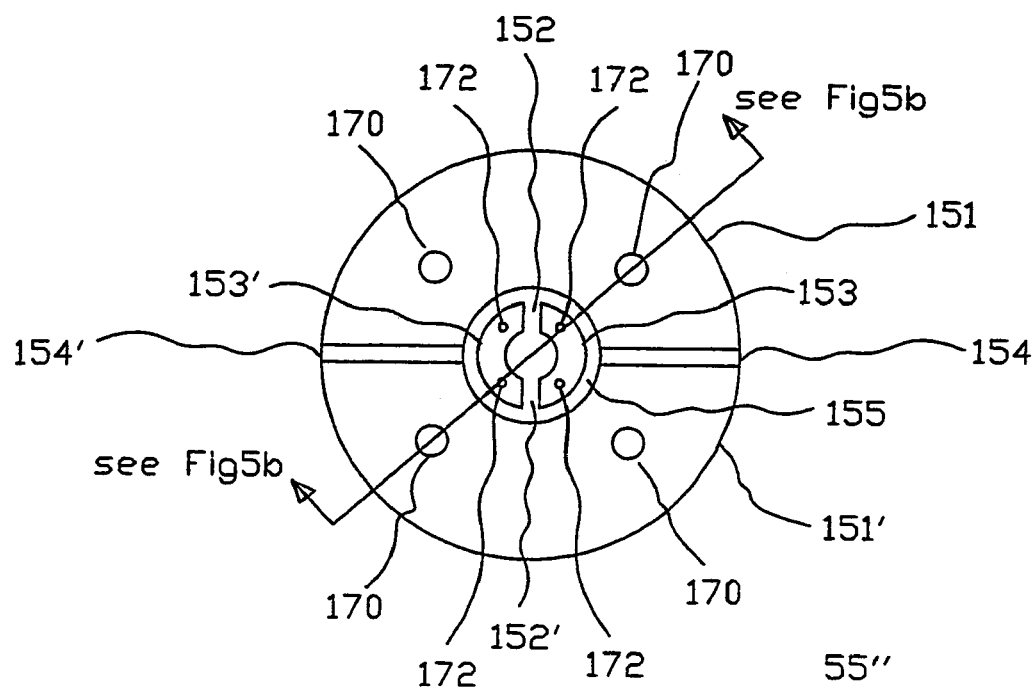
FIG. 5a represents an end member for implementing a pair of coaxial coils.
Figure 5B:
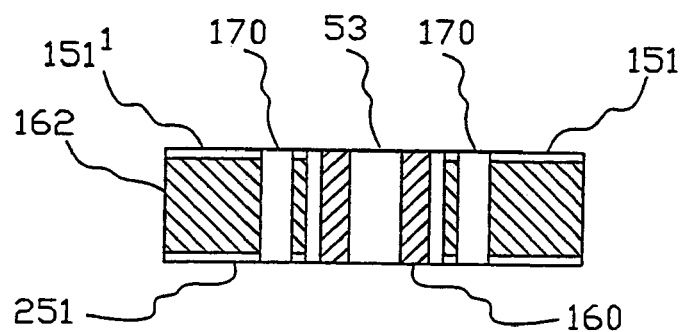

As a practical matter, an NMR probe employs a plurality of resonating means for coupling to a plurality of different nuclear spins present in the sample molecules under analysis. Coaxially disposed coils to serve this purpose may employ the structure described as either a (radially) inner coil, a (radially) outer coil, or both coils may share the novel structure. FIG. 5a is one surface of an end member 51"

having an inner coil pair of segments 153 and 153 separated by slots 152 and 152'. Outer coil segments 151 and 151' are similarly separated by slots 154 and 154' and circular slot 155 isolates the inner and outer coil end members. Aperture 53 accommodates a sample tube. The two coils are ordinarily required to resonant at rather widely separated frequencies. The fixed capacitances for the two coils are, in the first instance limited by their respective geometrical areas. Further gross relative capacitance may be obtained, if required, by implementing appropriate capacitance at one or the other end member for one or the other coil. Additional gross variation may be obtained by forming disparate dielectric material(s) between the opposite surfaces of an end member for respective co-axial coils as shown in FIG. 5b. As there shown (by way of example), separate monolithic dielectric portions 160 and 162 are disposed in alignment with the inner segments 153 and 153' to supply the desired capacitance for the circuit of the inner coil and another dielectric 162 selected for realizing the desired capacitance for the outer coil. Another approach to realizing a desired lumped capacitance for one of the coaxial coils comprises alternating sheets of dielectric 162 and (commonly connected) conducting surfaces (not shown) aligned with segments e.g., 151 and 151' to supply the desired capacitance for the outer coil circuit. Conducting surfaces 151 and 251 are external faces of the lumped capacitance. Independent adjustable capacitance for either inner or outer capacitance is available through a pair of independent coaxial adjustment linkages implemented as shown in FIG. 2d. Apertures for support of the paraxial conductors are labeled 170 for the outer coil and 172 for the inner coil.

In a preferred embodiment, each of the paraxial conductors 54a, 54b, 54c, and 54d are doubled by disposing each such conductor as an electrically paralleled pair of conductors in slight azimuthal displacement. The RF homogeneity is found to be improved as determined by the "81o/90o" method (see Vaugn, J. B. Jr, Spectroscopy, v.10, p. 36 (1995) and the inductance is slightly reduced allowing somewhat higher frequency performance.

Figure 6:
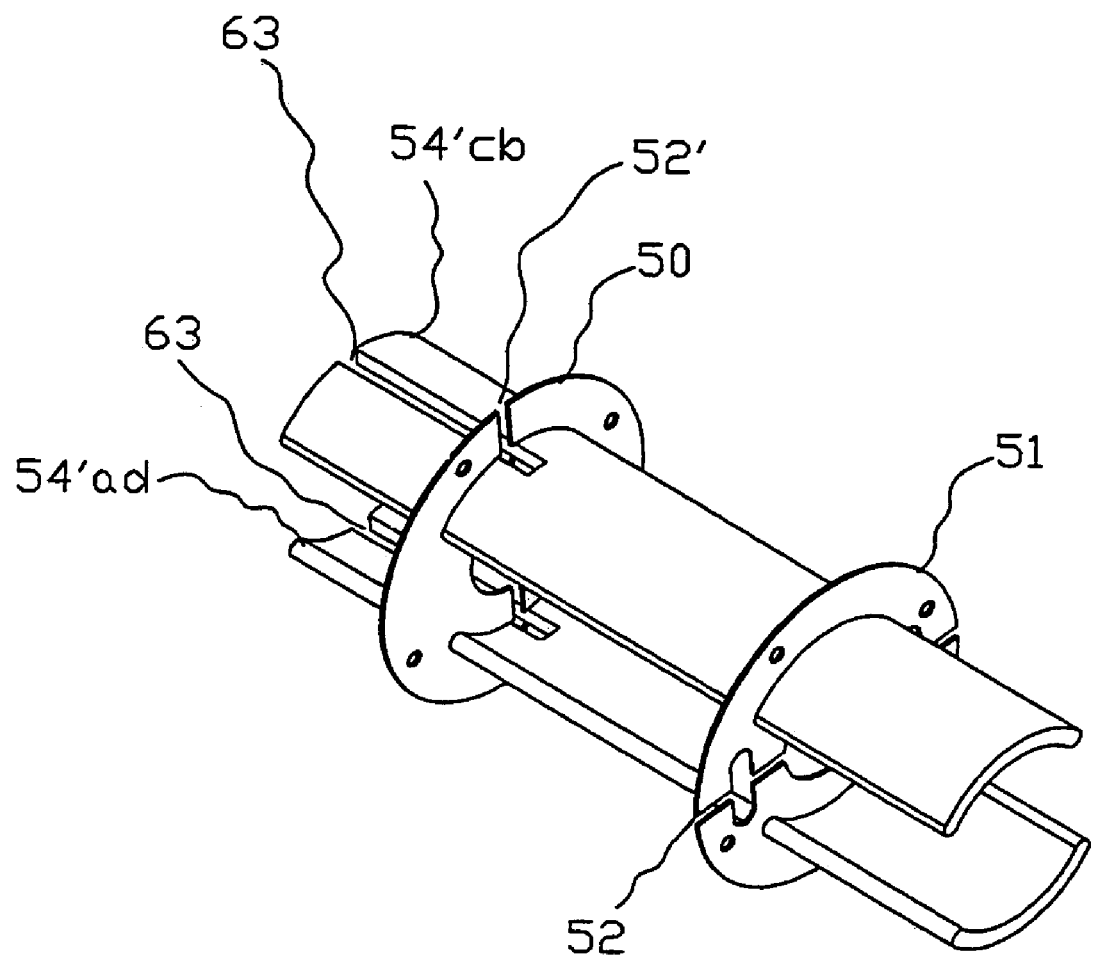
FIG. 6 is a 2 conductor (inductor) embodiment of the saddle coil of FIGS. 2a,b.

In another embodiment, present work is extended to a 2-inductor resonator as shown in FIG. 6. The separation of each of the paraxial conductor pairs (first pair 54a with 54d, and second pair 54c with 54b) is reduced to produce respective azimuthally distributed paraxial conductors (inductors) 54'ad and 54'cb in combination with end members 50 and 51. The conductors 54'ad and 54'cb are slotted at one end (slots 63) where slots 63 coincide with end member slot 52' to limit eddy current propogation. The capacitance required for the resonant structure is supported by the end member 51 in the manner of the FIG. 2c where an such end member is configured to receive the azimuthally distributed paraxial conductors.

The aperture and coil cross section referenced herein should not be understood as limited to a particular shape. Although circular cross section sample vessels and circular cross section coils are widely employed for NMR measurements, elliptical and rectangular shapes present certain advantages for static samples. See U.S. Pat. No. 6,917,201, commonly assigned. Nor should the paraxial conductors be interpreted as limited to any particular cross sectional shape.

Although this invention has been described with reference to particular embodiments and examples, other modifications and variations will occur to those skilled in the art in view of the above teachings. It should be understood that, within the scope of the appended claims, this invention may be practiced otherwise than as specifically described.

What is claimed is:

1. An NMR probe coil comprising:
   first and second planar conducting end members, at least one said end member comprising at least one pair of coplanar segments spaced apart along a locus in the plane of the end member, said locus forming a slot;
   said end members arranged in facing alignment and spaced apart to define an axial interval therebetween;
   at least 2n paraxial conductors extending between said first and second end members, n being positive integer, said conductors arranged in regular azimuthal intervals and having first and second ends;
   adjacent first ends of a first pair of adjacent said paraxial conductors electrically connected to a common segment of said first end member and adjacent second ends of respective said paraxial conductors connected to selected portions of said second end member; and
   each said end members further comprising a central aperture, said central apertures in alignment whereby a sample vessel may be introduced therebetween.

2. The NMR probe coil of claim 1, wherein said second end member comprises a planar conductor comprising a segmented structure similar to the segmented structure of the first end member, and wherein said second end member segments are rotated in respect to the segments of said first end member, whereby adjacent pairs of said paraxial conductors and said segments communicating therewith are capable of supporting an RF current loop, whereby said end members and said paraxial conductors comprise a saddle coil.

3. The NMR probe coil of claim 1, wherein said second end member comprises a planar conductor comprising a segmented structure similar to the segmented structure of the first end member, and wherein said second end member segments are aligned in respect to the segments of said first end member such that only one paraxial conductor communicates with any said segment, adjacent coplanar segments capacitively coupled whereby said paraxial conductors and said segments communicating therewith comprise a birdcage coil.

4. The NMR probe coil of claim 1, further comprising RF coupling means to communicate an RF signal between the coil and external apparatus.

5. The NMR probe coil of claim 4, wherein at least one said end member comprises a dielectric disposed between a pair of planar conducting surfaces, each said conducting surface segmented in congruence with said slot whereby said end member supplies a fixed capacitance.

6. The NMR probe of claim 5, further comprising a third conducting surface in proximity to one said planar conducting surface and a differential threaded shaft arranged to provide adjust means for variation of the separation of said third conducting surface from said one planar conducting surface.

7. The NMR probe coil of claim 4, wherein said coupling means comprises an inductive coupling loop disposed proximate at least one said paraxial conductor.

8. The NMR probe coil of claim 1, wherein each said paraxial conductor comprises at least a pair of spaced apart, axially extending parallel conductors in parallel electrical connection with a common segment, whereby the inductance of said paraxial conductor is reduced.

9. The NMR probe coil of claim 1 further comprising a plurality of non-conducting rods parallel to said conducting members, said rods supported in apertures of said end members and distributed around the periphery of said end members.

10. An NMR system for study of a sample comprising:
a magnet establishing and maintaining a magnetic field of selected properties;
at least one RF energy source exciting of a selected nuclear spin resonance of said sample;
a receiver detecting and processing of a nuclear spin resonance signal; and
an RF probe coupling said RF energy source and said receiver to nuclear spins of said sample,
said RF probe comprising an axial extending resonator, said resonator having axial inductive members for coupling to said sample, and planar end members comprising conducting surfaces, said conducting surfaces orthogonal to said axis, at least one said end member comprising at least one pair of coplanar segments spaced apart along a locus in the plane of the end member, which forms a slot, wherein said inductive members and said end members comprise a sensitive volume enveloping said sample, said end members disposed to confine the RF field developed by said inductive members in communication with said RF energy source and to support interconnects between selected said inductive members and to supply a selected capacitance for combination with said inductive members to support a resonant circuit.

* * * * *